(12) United States Patent
Kim

(10) Patent No.: US 8,559,254 B2
(45) Date of Patent: Oct. 15, 2013

(54) PRECHARGING CIRCUIT AND SEMICONDUCTOR MEMORY DEVICE INCLUDING THE SAME

(75) Inventor: Seung-Bong Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 67 days.

(21) Appl. No.: 13/178,033

(22) Filed: Jul. 7, 2011

(65) Prior Publication Data

US 2012/0008446 A1 Jan. 12, 2012

(30) Foreign Application Priority Data

Jul. 7, 2010 (KR) .................. 10-2010-0065375
Dec. 17, 2010 (KR) .................. 10-2010-0129746

(51) Int. Cl.
*G11C 7/00* (2006.01)

(52) U.S. Cl.
USPC ............... 365/203; 365/189.04; 365/210.12

(58) Field of Classification Search
USPC ................... 365/203, 189.04, 210.12
See application file for complete search history.

(56) References Cited

U.S. PATENT DOCUMENTS

| | | | |
|---|---|---|---|
| 6,771,550 B2 * | 8/2004 | Park ........................ | 365/203 |
| 7,447,089 B2 * | 11/2008 | Im et al. .................... | 365/203 |
| 7,525,857 B2 * | 4/2009 | Kim ........................ | 365/203 |
| 7,539,064 B2 * | 5/2009 | Lee ........................ | 365/185.24 |
| 7,701,798 B2 * | 4/2010 | Lee ........................ | 365/226 |
| 8,004,916 B2 * | 8/2011 | Park ........................ | 365/203 |

FOREIGN PATENT DOCUMENTS

| | | |
|---|---|---|
| KR | 1020000020558 | 4/2000 |
| KR | 1020020002681 | 1/2002 |
| KR | 1020080047157 | 5/2008 |
| KR | 1020090001245 | 1/2009 |

OTHER PUBLICATIONS

Office Action issued by the Korean Intellectual Property Office on Apr. 27, 2012.
Notice of Allowance issued by the Korean Intellectual Property Office on May 14, 2013.

* cited by examiner

*Primary Examiner* — Pho M Luu
(74) *Attorney, Agent, or Firm* — IP & T Group LLP

(57) ABSTRACT

A semiconductor memory device includes a write driver for transmitting data loaded on a global line to a local line pair, a read driver for transmitting data loaded on the local line pair to the global line, a core region for storing data loaded on the local line pair or provide stored data to the local line pair, and a precharging circuit configured to precharge the local line pair by selectively using a first voltage and a second voltage in response to a precharge control signal and an operation mode signal, wherein the second voltage is lower than the first voltage.

29 Claims, 8 Drawing Sheets

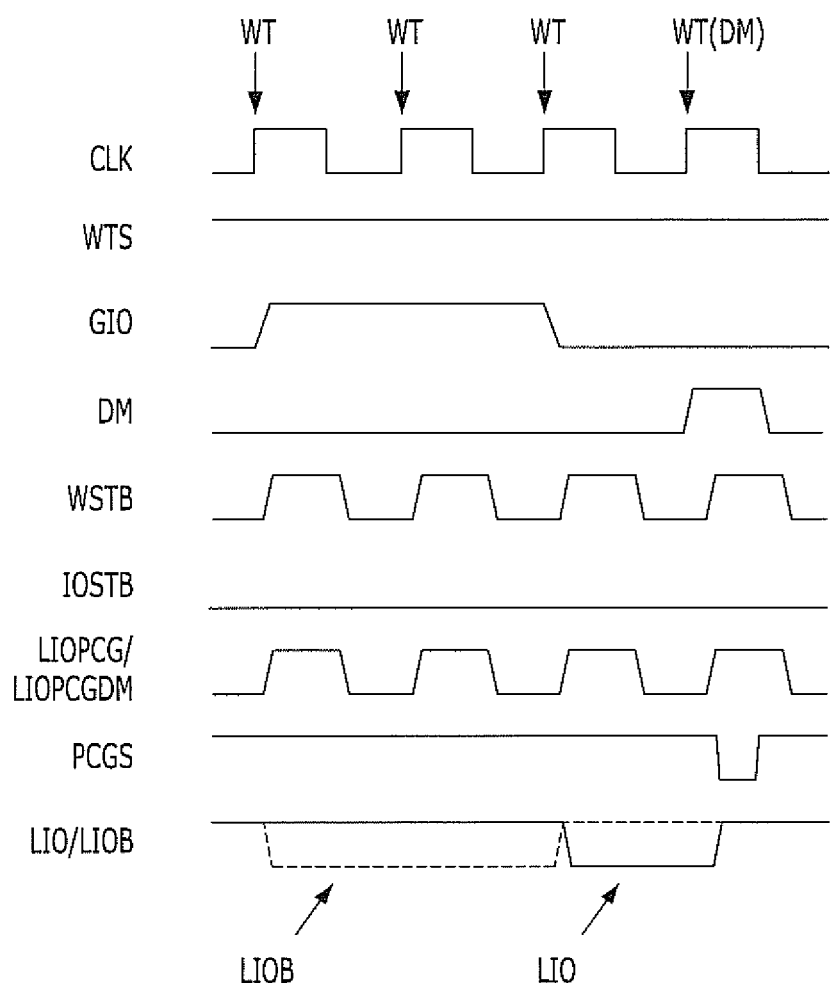

US 8,559,254 B2

PRECHARGING CIRCUIT AND SEMICONDUCTOR MEMORY DEVICE INCLUDING THE SAME

CROSS-REFERENCE TO RELATED APPLICATIONS

The present application claims priority of Korean Patent Application Nos. 10-2010-0065375 and 10-2010-0129746, filed on Jul. 7, 2010, and Dec. 17, 2010, respectively, which are incorporated herein by reference in their entirety.

BACKGROUND

1. Field

Exemplary embodiments of the present invention relate to semiconductor design technology, and more particularly, to a precharging circuit and a semiconductor memory device including the same.

2. Description of the Related Art

In general, a semiconductor memory device such as a DRAM (Dynamic Random Access Memory) device uses various input/output line pairs to write data in a core region or read data stored in the core region. Among input/output line pairs, a local input/output line pair is precharged before the performance of a next write operation or a next read operation because the input/output lines have different voltage levels after the performance of a read operation or a write operation. Further, in performing a burst operation function, where reading or writing data is performed two or more times consecutively, a semiconductor memory device precharges the local input/output line pair between the data processing operations.

FIG. 1 is a diagram illustrating a structure of a semiconductor memory device including a conventional precharging circuit.

Referring to FIG. 1, a semiconductor memory device 100 includes a write driver 110 configured to transmit data, loaded on a global input/output line GIO, to a local input/output line pair LIO/LIOB in a write operation mode, a read driver 120 configured to transmit data, loaded on the local input/output line pair LIO/LIOB, to the global input/output line GIO in a read operation mode, a precharging circuit 130 configured to precharge the local input/output line pair LIO/LIOB in response to a precharge control signal LIOPCG, and a core region 140 configured to store data loaded on the local input/output line pair LIO/LIOB in the write operation mode and transmit stored data to the local input/output line pair LIO/LIOB in the read operation mode.

The write driver 110 transmits data, loaded on the global input/output line GIO, to the local input/output line pair LIO/LIOB in response to a write driver strobe signal WSTB. More specifically, the write driver 110 drives the local input/output line pair LIO/LIOB with a desired voltage (e.g., the core voltage VCORE) in response to data transmitted through the global input/output line GIO.

The read driver 120 transmits data, loaded on the local input/output line pair LIO/LIOB, to the global input/output line GIO in response to a read driver strobe signal IOSTB. In general, the read driver 120 includes an input/output sense amplifier (IOSA).

The precharging unit 130 includes first to third PMOS transistors P1, P2 and P3 configured to precharge the local input/output line pair LIO/LIOB to the level of the core voltage VCORE. Herein, the precharge control signal LIOPCG is applied to the gate terminals of the first to third PMOS transistors P1, P2 and P3 after passing through first and second inverters INV1 and INV2. When precharge control signal LIOPCG is activated to a logic low level, the first to third PMOS transistors P1, P2 and P3 are turned on to precharge the local input/output line pair LIO/LIOB to the level of the core voltage VCORE.

The core region 140 includes a bit line sense amplifier (BLSA) and a memory cell array (not illustrated). In a read/write operation mode, the core region 140 transmits data stored in a memory cell to the local input/output line pair LIO/LIOB or store data loaded on the local input/output line pair LIO/LIOB in a memory cell.

Hereinafter, operations of the semiconductor memory device 100 will be described with reference to FIGS. 2A and 2B.

FIG. 2A is a timing diagram illustrating an operation of the semiconductor memory device 100 in a read operation mode. FIG. 2B is a timing diagram illustrating an operation of the semiconductor memory device 100 in a write operation mode.

Referring to FIG. 2A, when a read command RD is inputted in synchronization with a rising edge of a clock signal CLK, data from the core region 140 are loaded on the local input/output line pair LIO/LIOB.

Next, the read driver 120 sequentially amplifies data, loaded on the local input/output line pair LIO/LIOB, in response to the read driver strobe signal IOSTB and transmits the results to the global input/output line GIO. In response to the precharge control signal LIOPCG, the precharging unit 130 precharges the local input/output line pair LIO/LIOB by the core voltage VCORE before the next read operation, that is, between the read commands RD. In this context, data transmitted consecutively from the core region 140 are sequentially amplified by the bit line sense amplifier (BLSA) and are loaded on the local input/output line pair LIO/LIOB. The data amplified by the bit line sense amplifier (BLSA) are transmitted to the local input/output line pair LIO/LIOB as a signal having a smaller voltage swing range than the output of the write driver 110. Therefore, the precharging operation is performed between the read commands RD so that the data consecutively loaded on the local input/output line pair LIO/LIOB are accurately transmitted to the global input/output line GIO.

Referring to FIG. 2B, when a write command WT is inputted in synchronization with a rising edge of the clock signal CLK, the relevant data are loaded on the global input/output line GIO.

Next, the write driver 110 sequentially transmits data, loaded on the global input/output line GIO, to the local input/output line pair LIO/LIOB in response to the write driver strobe signal WSTB. Since the write driver 110 drives the local input/output line pair LIO/LIOB with a sufficiently large driving power, the data loaded on the local input/output line pair LIO/LIOB forms a signal with a large voltage swing range. As in the read operation mode, in response to the precharge control signal LIOPCG, the precharging unit 130 precharges the local input/output line pair LIO/LIOB between the write commands WT.

Here, the conventional semiconductor memory device 100 has the following features.

As described above, the precharging unit 130 performs a precharging operation between the read command RD and the write command WT. However, the read operation mode is to have a precharging operation, but a precharging operation is optional in the write operation mode. More specifically, a precharging operation is to be performed before/after the input of the read command RD for accurate data transmission because data corresponding to a signal with a small voltage swing range is loaded on the local input/output line pair LIO/LIOB, whereas a precharging operation is not necessary in the write operation mode because data of a signal with a large voltage swing range is loaded on the local input/output line pair LIO/LIOB. However, as illustrated in FIG. 2B, in the write operation mode, the precharge control signal LIOPCG is continuously toggled according to the consecutively-inputted write command WT.

Accordingly, the local input/output line pair LIO/LIOB is precharged to the level of the core voltage VCORE whenever the write command WT is inputted and the power consumption due to precharging to the core voltage VCORE in the consecutive write operations unnecessarily occurs. Also, since the precharge operation is performed whenever the write command WT is inputted, the write driver 110 pulls down the local input/output line pair LIO/LIOB precharged to the level of the core voltage VCORE, thus cause unnecessary power consumption in the write driver 110.

SUMMARY

An embodiment of the present invention is directed to a precharging circuit for minimizing the power consumption in a write operation mode, and a semiconductor memory device including the same.

In accordance with an embodiment of the present invention, a precharging circuit includes: a voltage selection providing unit configured to selectively provide a first voltage and a second voltage in response to an operation mode signal, wherein the second voltage is lower than the first voltage; and a precharging unit configured to precharge an input/output line pair with the selected voltage provided from the voltage selection providing unit in response to a precharge control signal.

In accordance with another embodiment of the present invention, a semiconductor memory device includes: a write driver configured to transmit data loaded on a global line to a local line pair; a read driver configured to transmit data loaded on the local line pair to the global line; a precharging circuit configured to precharge the local line pair by selectively using a first voltage and a second voltage in response to a precharge control signal and an operation mode signal, wherein the second voltage is lower than the first voltage.

In accordance with another embodiment of the present invention, a precharging circuit includes: a precharge control unit configured to receive a precharge signal in response to an operation command and output a precharge control signal by restricting a toggling period of the precharge signal according to a operation mode signal; and a precharging unit configured to precharge an input/output line pair in response to the precharge control signal.

In accordance with another embodiment of the present invention, a semiconductor memory device includes: a write driver configured to transmit data loaded on a global line to a local line pair; a read driver configured to transmit data loaded on the local line pair to the global line; a core region configured to store data loaded on the local line pair or provide stored data to the local line pair; and a precharging circuit configured to restrictively precharge the local line pair in response to a precharge signal, an operation mode signal, and a data mask signal.

BRIEF DESCRIPTION OF THE DRAWINGS

FIG. 6B is a timing diagram illustrating an operation of the semiconductor memory device of FIG. 5 in a write operation mode.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 1:
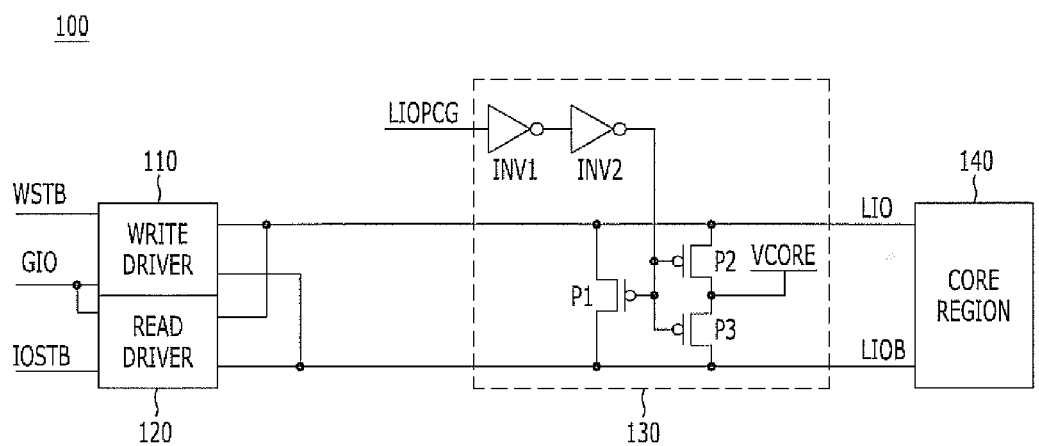
FIG. 1 is a diagram illustrating a structure of a semiconductor memory device including a conventional precharging circuit.
Figure 2A:
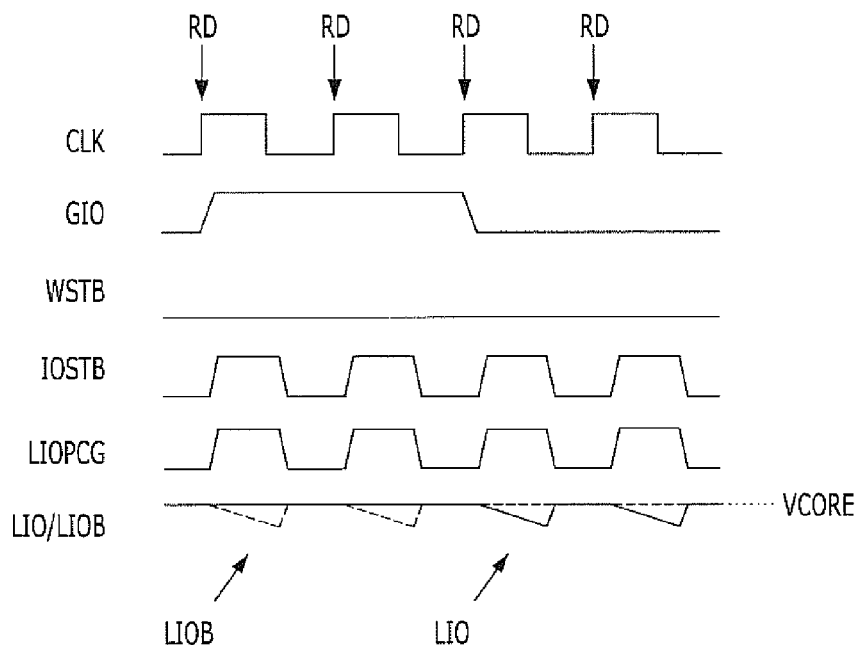
FIG. 2A is a timing diagram illustrating an operation of the semiconductor memory device of FIG. 1 in a read operation mode.
Figure 2B:
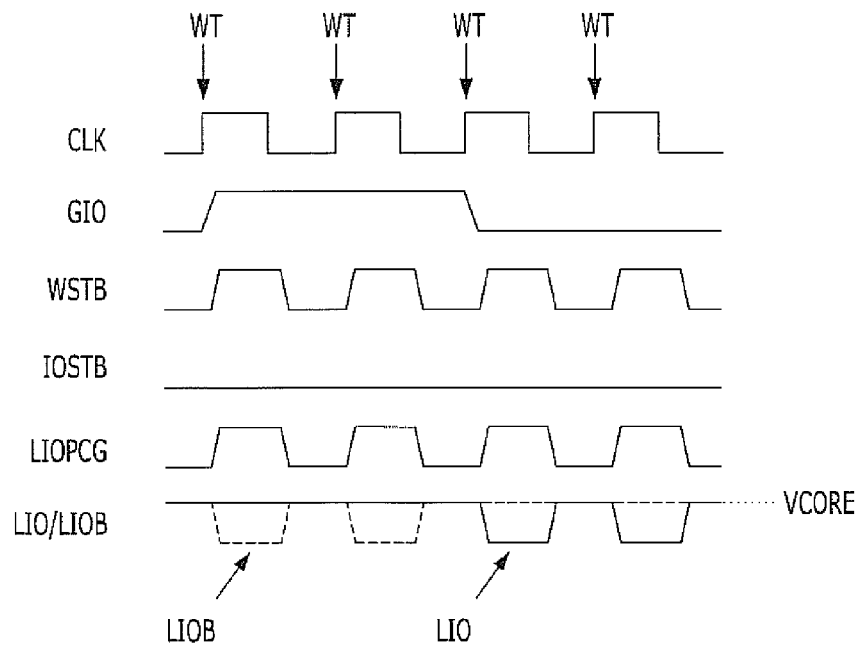
FIG. 2B is a timing diagram illustrating an operation of the semiconductor memory device of FIG. 1 in a write operation mode.
Figure 3:
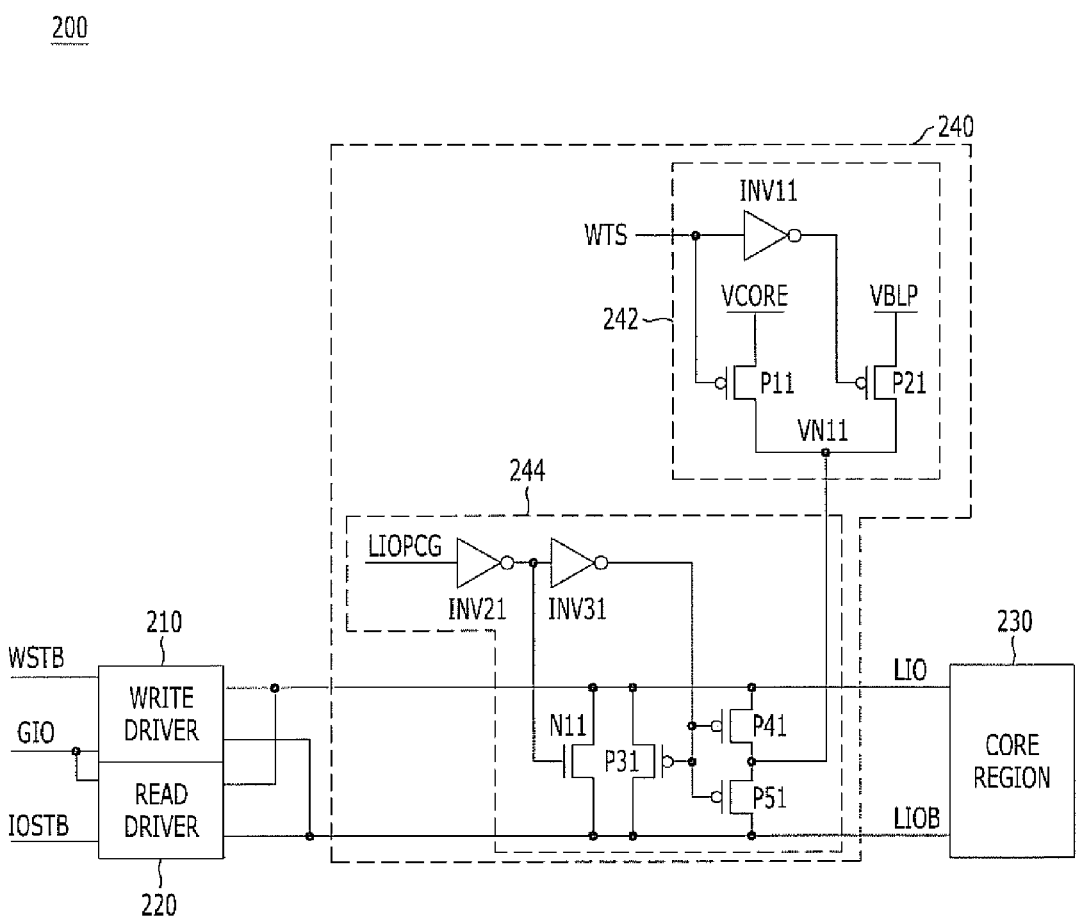
FIG. 3 is a diagram illustrating a structure of a semiconductor memory device including a precharging circuit in accordance with a first embodiment of the present invention.

FIG. 3 is a diagram illustrating a structure of a semiconductor memory device including a precharging circuit in accordance with a first embodiment of the present invention.

Referring to FIG. 3, a semiconductor memory device 200 in accordance with an exemplary embodiment of the present invention includes a write driver 210 configured to transmit data, loaded on a global input/output line GIO, to a local input/output line pair LIO/LIOB, a read driver 220 configured to transmit data, loaded on the local input/output line pair LIO/LIOB, to the global input/output line GIO, a core region 230 configured to store data loaded on the local input/output line pair LIO/LIOB or provide stored data to the local input/output line pair LIO/LIOB, and a precharging circuit 240 configured to precharge the local input/output line pair LIO/LIOB by selectively using a core voltage VCORE and a bit line precharge voltage VBLP according to a precharge control signal LIOPCG and an operation mode signal WTS. By using logic levels of the operation mode signal WTS, a read operation mode and a write operation mode are differentiated. According to an example, the bit line precharge voltage VBLP has a voltage level corresponding to a half of the core voltage VCORE.

The write driver 210 transmits data, loaded on the global input/output line GIO, to the local input/output line pair LIO/LIOB in response to a write driver strobe signal WSTB. More specifically, the write driver 210 drives the local input/output line pair LIO/LIOB with a desired voltage (e.g., the core voltage VCORE) in response to data transmitted through the global input/output line GIG.

The read driver 220 transmits data, loaded on the local input/output line pair LIO/LIOB, to the global input/output line GTO in response to a read driver strobe signal IOSTB. According to an example, the read driver 220 includes an input/output sense amplifier (IOSA).

The core region 230 includes a bit line sense amplifier (BLSA) and a memory cell array (not illustrated). In a read/write operation mode, the core region 230 transmits data stored in a memory cell to the local input/output line pair LIO/LIOB, or stores in a memory cell data loaded on the local input/output line pair LIO/LIOB.

The precharging circuit 240 includes a voltage selection providing unit 242 configured to selectively provide the core voltage VCORE and the bit line precharge voltage VBLP in response to the operation mode signal WTS and a precharging unit 244 configured to precharge the local input/output line pair LIO/LIOB by the voltage, provided from the voltage selection providing unit 242, in response to the precharge control signal LIOPCG.

The voltage selection providing unit 242 provides the core voltage VCORE to the precharging unit 244 in the read operation mode and provides the bit line precharge voltage VBLP to the precharging unit 244 in the write operation mode. The voltage selection providing unit 242 includes a first PMOS transistor P11 connected between a core voltage (VCORE) terminal and a voltage providing node VN11 to receive the operation mode signal WTS as a gate input, a first inverter INV11 configured to invert the operation mode signal WTS, and a second PMOS transistor P21 connected between a bit line precharge voltage (VBLP) terminal and the voltage providing node VN11 to receive an output signal of the first inverter INV11 as a gate input.

The precharging unit 244 includes a second inverter INV21 configured to invert the precharge control signal LIOPCG, a third inverter INV31 configured to invert an output signal of the second inverter INV21, a first NMOS transistor N11 connected between the local input/output line pair LIO/LIOB to receive the output signal of the second inverter INV21 as a gate input, a third PMOS transistor P31 connected between the local input/output line pair LIO/LIOB to receive an output signal of the third inverter INV31 as a gate input, a fourth PMOS transistor P41 connected between the voltage providing node VN11 and one local line LIQ of the local input/output line pair LIO/LIOB to receive the output signal of the third inverter INV31 as a gate input, and a fifth PMOS transistor P51 connected between the voltage providing node VN11 and the other local line LIOB of the local input/output line pair LIO/LIOB to receive the output signal of the third inverter INV31 as a gate input. The fourth PMOS transistor P41 and the fifth PMOS transistor P51 precharge the local input/output line pair LIO/LIOB in response to the precharge control signal LIOPCG, and the first NMOS transistor N11 and the third PMOS transistor P31 equalize the local input/output line pair LIO/LIOB in response to the precharge control signal LIOPCG. In particular, the first NMOS transistor N11 is used as a main element for equalizing the local input/output line pair LIO/LIOB in the write operation mode because the third PMOS transistor P31 has a poor equalizing performance when the local input/output line pair LIO/LIOB is precharged by the bit line precharge voltage VBLP in the write operation mode. The third PMOS transistor P31 has a poor equalizing performance because the bit line precharge voltage VBLP has a voltage level closer to a ground voltage VSS than to a power supply voltage VDD. Thus, both the first NMOS transistor N11 and the third PMOS transistor P31 are turned on in the write operation mode to stably equalize the local input/output line pair LIO/LIOB.

Hereinafter, operations of the semiconductor memory device 200 in accordance with the first embodiment of the present invention are described with reference to FIGS. 4A and 4B.

Figure 4A:
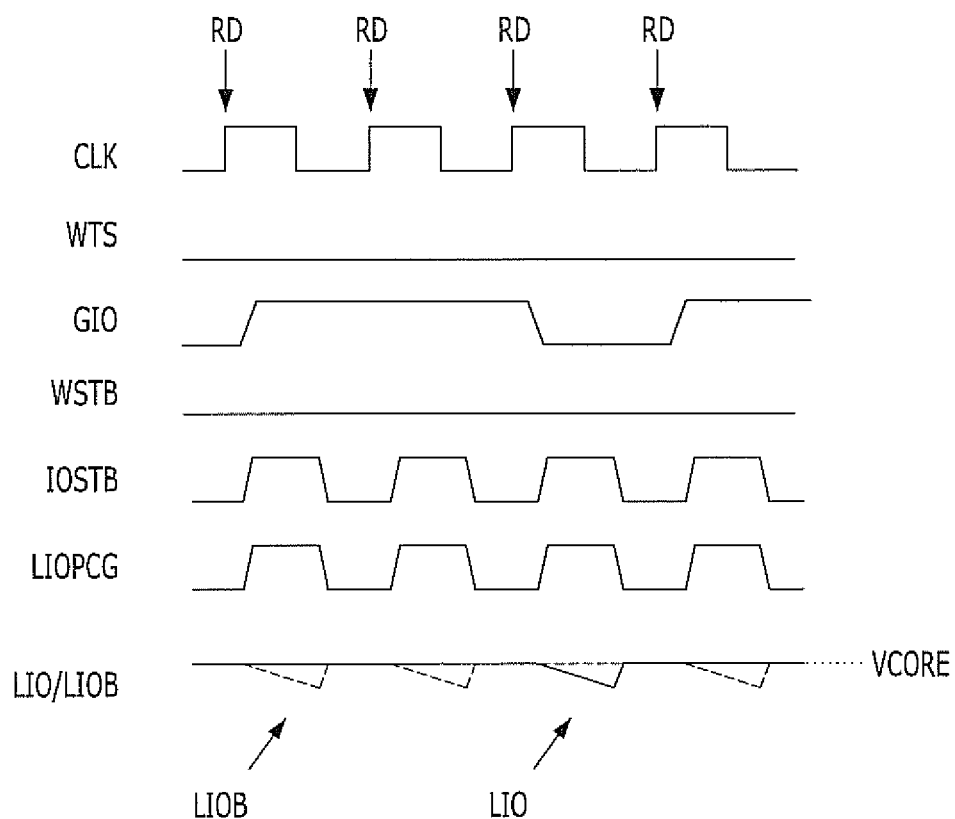
FIG. 4A is a timing diagram illustrating an operation of the semiconductor memory device of FIG. 3 in a read operation mode.

FIG. 4A is a timing diagram illustrating an operation of the semiconductor memory device 200 in a read operation mode. FIG. 4B is a timing diagram illustrating an operation of the semiconductor memory device 200 in a write operation mode.

Referring to FIG. 4A, the voltage selection providing unit 242 (FIG. 3) provides the core voltage VCORE to the precharging unit 244 in the read operation mode. More specifically, the first PMOS transistor P11 is turned on according to the low-level operation mode signal WTS inputted into a gate thereof, and the second PMOS transistor P21 is turned off according to the output signal of the first inverter INV11 inputted into a gate thereof, where the output signal is an inversion signal of the operation mode signal WTS and has a logic high level, so that the voltage providing node VN11 is connected to a core voltage (VCORE) terminal.

In this state, when a read command RD is inputted in synchronization with a rising edge of a clock signal CLK, the read driver 220 sequentially amplifies data, loaded on the local input/output line pair LIO/LIOB, in response to the read driver strobe signal IOSTB and transmits the results to the global input/output line GIO.

In response to the precharge control signal LIOPCG, the precharging unit 244 precharges the local input/output line pair LIO/LIOB to the level of the core voltage VCORE before/after the read operation, that is, between the read commands RD. In this context, data transmitted consecutively from the memory cell of the core region 230 are sequentially amplified by the bit line sense amplifier (BLSA) and are loaded on the local input/output line pair LIO/LIOB.

The data amplified by the bit line sense amplifier (BLSA) are transmitted to the local input/output line pair LIO/LIOB as a signal having a smaller voltage swing range than the output of the write driver 210. Therefore, the precharging operation is performed between the read commands RD so that the data consecutively loaded on the local input/output line pair LIO/LIOB are accurately transmitted to the global input/output line GIO.

The precharging unit 244 equalizes the local input/output line pair LIO/LIOB while precharging the local input/output line pair LIO/LIOB. More specifically, the first NMOS transistor N11 and the third PMOS transistor P31 are turned on in the precharge period in response to the precharge control signal LIOPCG. Since the local input/output line pair LIO/LIOB is precharged by the core voltage VCORE closer to the power supply voltage VDD than to the ground voltage VSS, the third PMOS transistor P31 rather than the first NMOS transistor N11 operates as a main element for equalizing the local input/output line pair LIO/LIOB.

Figure 4B:
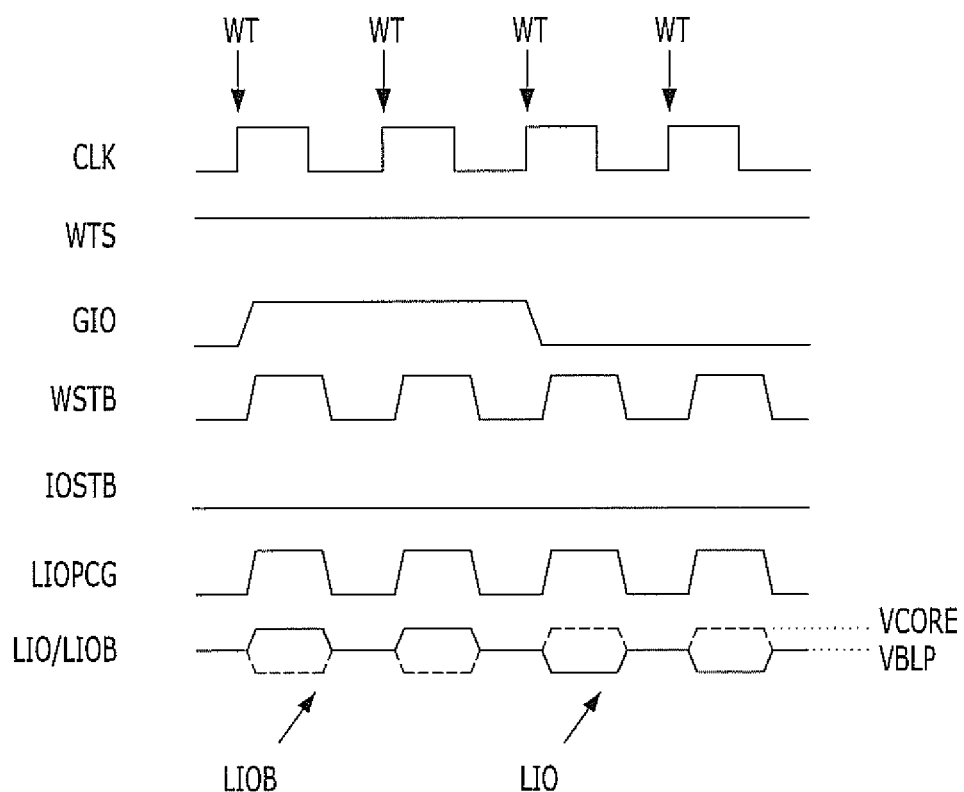
FIG. 4B is a timing diagram illustrating an operation of the semiconductor memory device of FIG. 3 in a write operation mode.

Referring to FIG. 4B, the voltage selection providing unit 242 provides the bit line precharge voltage VBLP to the precharging unit 244 in the write operation mode. More specifically, the first PMOS transistor P11 is turned off according to the high-level operation mode signal WTS inputted into a gate thereof, and the second PMOS transistor P21 is turned on according to the output signal of the first inverter INV11 inputted into a gate thereof, where the output signal is an inversion signal of the operation mode signal WTS and has a logic low level, so that the voltage providing node VN11 is connected to a bit line precharge voltage (VBLP) terminal.

In this state, when a write command WT is inputted in synchronization with a rising edge of the clock signal CLK, the write driver 210 sequentially transmits data, loaded on the global input/output line GIO, to the local input/output line pair LIO/LIOB in response to the write driver strobe signal WSTB. Since the write driver 210 drives the local input/output line pair LIO/LIOB with a sufficiently large driving power, the data loaded on the local input/output line pair LIO/LIOB results in a signal with a large voltage swing range.

In response to the precharge control signal LIOPCG, the precharging unit 244 precharges the local input/output line pair LIO/LIOB by the bit line precharge voltage VBLP before/after the write operation, that is, between the write commands WT.

The precharging unit 244 equalizes the local input/output line pair LIO/LIOB while precharging the local input/output line pair LIO/LIOB. More specifically, the first NMOS transistor N11 and the third PMOS transistor P31 are turned on in the precharge period in response to the precharge control signal LIOPCG. Since the local input/output line pair LIO/LIOB is precharged by the bit line precharge voltage VBLP closer to the ground voltage VSS than to the power supply voltage VDD, the first NMOS transistor N11 rather than the third PMOS transistor P31 operates as a main element for equalizing the local input/output line pair LIO/LIOB.

In accordance with the first embodiment of the present invention, the local input/output line pair LIO/LIOB is precharged in the write operation mode by the bit line precharge voltage VBLP having a lower level than the core voltage VCORE to reduce power consumption.

Figure 5:
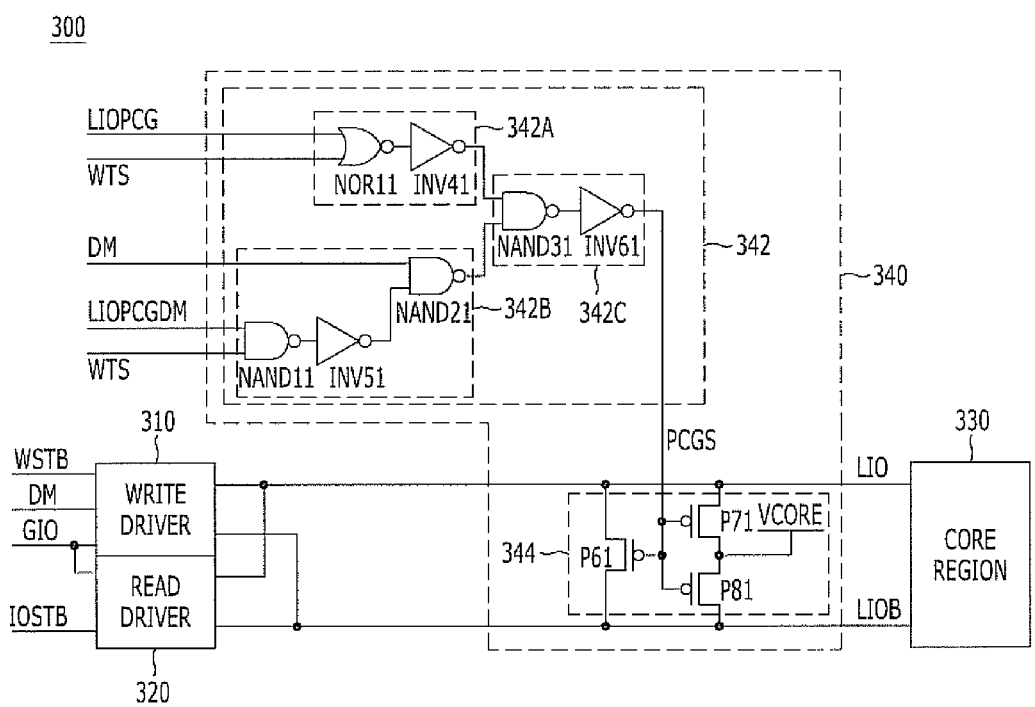
FIG. 5 is a diagram illustrating a structure of a semiconductor memory device including a precharging circuit in accordance with a second embodiment of the present invention.

FIG. 5 is a diagram illustrating a structure of a semiconductor memory device including a precharging circuit in accordance with a second embodiment of the present invention.

Referring to FIG. 5, a semiconductor memory device 300 in accordance with a second embodiment of the present invention includes a write driver 310 configured to transmit data, loaded on a global input/output line GIO, to a local input/output line pair LIO/LIOB, in a write operation mode, a read driver 320 configured to transmit data, loaded on the local input/output line pair LIO/LIOB, to the global input/output line GIO, in a read operation mode, a core region 330 configured to store data loaded on the local input/output line pair LIO/LIOB in a write operation mode and transmit stored data to the local input/output line pair LIO/LIOB in a read operation mode, and a precharging circuit 340 configured to restrictively precharge the local input/output line pair LIO/LIOB in response to a precharge signal LIOPCG, an operation mode signal WTS, a data mask precharge signal LIOPCGDM, and a data mask signal DM. Here, the precharge signal LIOPCG is toggled according to a read command inputted in a read operation mode and a write command inputted in a write operation mode. The operation mode signal WTS is used to detect a read operation mode and a write operation mode according to its logic levels.

The write driver 310 transmits data, loaded on the global input/output line GIO, to the local input/output line pair LIO/LIOB in response to a write driver strobe signal WSTB. More specifically, the write driver 310 drives the local input/output line pair LIO/LIOB with a desired voltage in response to data transmitted through the global input/output line GIO. In response to the data mask signal DM, the write driver 310 skips corresponding data among the data loaded on the global input/output line GIO, and transmits remaining data to the local input/output line pair LIO/LIOB. For example, if a burst length is '8', eight data BL0-BL7 are consecutively loaded on the global input/output line GIO. In this case, when the data mask signal DM is activated in response to the first data BL0, only the remaining data BL1-BL7 are transmitted to the local input/output line pair LIO/LIOB.

The read driver 320 transmits data, loaded on the local input/output line pair LIO/LIOB, to the global input/output line GIO in response to a read strobe signal IOSTB. According to an example, the read driver 320 includes an input/output sense amplifier (IOSA).

The core region 330 includes a bit line sense amplifier (BLSA) and a memory cell array (not illustrated). In a read/write operation mode, the core region 330 transmits data stored in a memory cell to the local input/output line pair LIO/LIOB or stores in a memory cell data loaded on the local input/output line pair LIO/LIOB.

The precharging circuit 340 includes a precharging control unit 342 configured to output a precharge control signal PCGS by controlling a toggling period of the precharge signal LIOPCG in response to the operation mode signal WTS and a precharging unit 344 configured to precharge the local input/output line pair LIO/LIOB by the core voltage VCORE in response to the precharge control signal PCGS.

The precharging control unit 342 limits a toggling period of the precharge signal LIOPCG to be within a read operation mode period in outputting the precharge control signal PCGS, wherein the precharge control signal PCGS is activated in a write operation mode period, for example, only when the data mask signal DM is activated. The precharging control unit 342 includes a toggling period restricting unit 342A configured to restrict a toggling period of the precharge signal LIOPCG in response to the operation mode signal WTS, an activation period determining unit 342B configured to determine an activation period of the precharge control signal PCGS in response to the data mask precharge signal LIOPCGDM and the operation mode signal WTS, and an output unit 342C configured to output the precharge control signal PCGS in response to an output signal of the toggling period restricting unit 342A and an output signal of the activation period determining unit 342B. The toggling period restricting unit 342A includes a first NOR gate NOR11 configured to perform a NOR operation on the precharge signal LIOPCG and the operation mode signal WTS and a first inverter INV41 configured to invert an output signal of the first NOR gate NOR11. The activation period determining unit 342B includes a first NAND gate NAND11 configured to perform a NAND operation on the data mask precharge signal LIOPCGDM and the operation mode signal WTS, a second inverter INV51 configured to invert an output signal of the first NAND gate NAND11, and a second NAND gate NAND21 configured to perform a NAND operation on the data mask signal DM and an output signal of the second inverter INV51. The output unit 342C includes a third NAND gate NAND31 configured to perform a NAND operation on an output signal of the first inverter INV41 and an output signal of the second NAND gate NAND21, and a third inverter INV61 configured to invert an output signal of the third NAND gate NAND31.

The precharging unit 344 includes first to third PMOS transistors P61, P71 and P81 configured to precharge the local input/output line pair LIO/LIOB to the level of the core voltage VCORE. Here, the precharge control signal PCGS is applied to gate terminals of the first to third PMOS transistors P61, P71 and P81. Accordingly, when the precharge control signal PCGS is activated to a logic low level, the first to third PMOS transistors P61, P71 and P81 are turned on to precharge the local input/output line pair LIO/LIOB to the level of the core voltage VCORE.

Hereinafter, operations of the semiconductor memory device 300 in accordance with the second embodiment of the present invention are described with reference to FIGS. 6A and 6B.

Figure 6A:
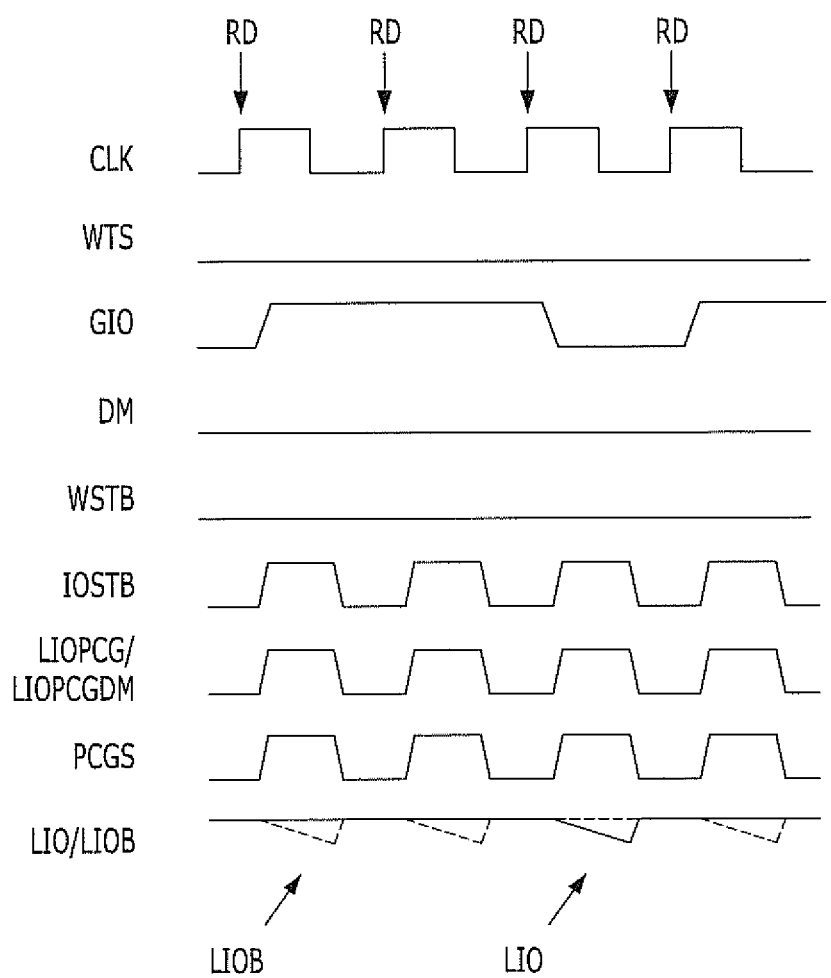
FIG. 6A is a timing diagram illustrating an operation of the semiconductor memory device of FIG. 5 in a read operation mode.

FIG. 6A is a timing diagram illustrating an operation of the semiconductor memory device 300 in a read operation mode. FIG. 6B is a timing diagram illustrating an operation of the semiconductor memory device 300 in a write operation mode.

Referring to FIG. 6A, when a read command RD is inputted in synchronization with a rising edge of a clock signal CLK, the read driver 320 (FIG. 5) sequentially amplifies data, loaded on the local input/output line pair LIO/LIOB, in response to the read driver strobe signal IOSTB and transmits the results to the global input/output line GIO. In response to the precharge control signal PCGS received from the precharging control unit 342, the precharging unit 344 precharges the local input/output line pair LIO/LIOB to the level of the core voltage VCORE before/after the read operation, that is, between the read commands RD. In this context, data transmitted consecutively from the memory cell of the core region 330 are sequentially amplified by the bit line sense amplifier (BLSA) and are loaded on the local input/output line pair LIO/LIOB. The data amplified by the bit line sense amplifier (BLSA) are transmitted to the local input/output line pair LIO/LIOB as a signal having a smaller voltage swing range than the output of the write driver 310. Therefore, the precharging operation is performed between the read commands RD so that the data consecutively loaded on the local input/output line pair LIO/LIOB are accurately transmitted to the global input/output line GIO.

The operation of the precharging control unit 342 is briefly described below. In a read operation mode, since the data mask signal DM maintains a logic low level, the output signal of the activation period determining unit 342B maintains a logic high level. Since the operation mode signal WTS maintains a logic low level, the output signal of the toggling period restricting unit 342A is toggled in accordance with the precharge signal LIOPCG. Accordingly, the precharge control signal PCGS outputted through the output unit 342C toggles according to the precharge signal LIOPCG. That is, in the read operation mode, the precharge control signal PCGS toggling in response to the precharge signal LIOPCG is applied to the precharging unit 344.

Referring to FIG. 6B, when a write command WT is inputted in synchronization with a rising edge of the clock signal CLK, the write driver 310 sequentially transmits data, loaded on the global input/output line GIO, to the local input/output line pair LIO/LIOB in response to the write driver strobe signal WSTB. Since the write driver 310 drives the local input/output line pair LIO/LIOB with a sufficiently large driving power, the data is loaded on the local input/output line pair LIO/LIOB by a signal with a large voltage swing range.

Regardless of the input of the write command WT, when the data mask signal DM is deactivated, the precharging unit 344 does not perform a precharging operation according to the precharge control signal PCGS received from the precharging control unit 342. The precharging unit 344 performs a precharging operation only when the data mask signal DM is activated. Specifically, in a write operation mode, since the data mask signal DM maintains a logic low level, the output signal of the activation period determining unit 342B maintains a logic high level. Also, since the operation mode signal WTS has a logic high level, the output signal of the toggling period restricting unit 342A has a logic high level. Accordingly, since the precharge control signal PCGS outputted through the output unit 342C has a logic high level, the first to third PMOS transistors P61, P71 and P81 maintain a turn-off state, so a precharge operation is not performed. In this state, when the data mask signal DM is activated to a logic high level, the output signal of the activation period determining unit 342B is generated such that the data mask precharge signal LIOPCGDM is inverted and the output signal of the toggling period restricting unit 342A maintains a logic high level. Accordingly, the precharge control signal PCGS outputted through the output unit 342C is generated such that the data mask precharge signal LIOPCGDM is inverted. Here, since the precharge control signal PCGS has a logic low level, for example, only in the activation period of the data mask signal DM, the first to third PMOS transistors P61, P71 and P81 are turned on to perform a precharging operation.

Consequently, in the write operation mode, since the local input/output line pair LIO/LIOB is not precharged according to the operation mode signal WTS in the period other than the activation period of the data mask signal DM, the local input/output line pair LIO/LIOB is toggled according to, for example, only the toggling state of the global input/output line GIO. Accordingly, since the local input/output line pair LIO/LIOB is pulled down according to only the toggling stage of the global input/output line GIO, the power consumption is reduced.

In accordance with the second embodiment of the present invention, unnecessary precharge operations are prevented to reduce power consumption in the write driver 310.

As described above, the present invention precharges the local input/output line pair in the write operation mode by the bit line precharge voltage having a lower level than the core voltage, thereby minimizing the power consumption.

Also, the present invention restricts the toggling period of the precharge signal to prevent an unnecessary precharge operation in the write operation mode and reduce power consumption.

While the present invention has been described with respect to the specific embodiments, it will be apparent to those skilled in the art that various changes and modifications may be made without departing from the spirit and scope of the invention as defined in the following claims.

What is claimed is:

1. A precharging circuit comprising:
   a voltage selection providing unit configured to selectively provide a first voltage and a second voltage in response to an operation mode signal, wherein the second voltage is lower than the first voltage; and
   a precharging unit configured to precharge an input/output line pair with the selected voltage provided from the voltage selection providing unit in response to a precharge control signal,
   wherein different logic levels of the operation mode signal indicate a read operation mode and a write operation mode, respectively.

2. The precharging circuit of claim 1, wherein the second voltage is equal to a half of the first voltage.

3. The precharging circuit of claim 2, wherein the first voltage is a core voltage and the second voltage is a bit line precharge voltage.

4. The precharging circuit of claim 1, wherein the voltage selection providing unit is configured to provide the first voltage to the precharging unit in the read operation mode.

5. The precharging circuit of claim 4, wherein the voltage selection providing unit is configured to provide the second voltage to the precharging unit in the write operation mode.

6. The precharging circuit of claim 5, wherein the voltage selection providing unit comprises:
   a first PMOS transistor connected between a first voltage terminal and a voltage providing node to receive the operation mode signal as a gate input;
   a first inverter configured to invert the operation mode signal; and a second PMOS transistor connected between a second voltage terminal and the voltage providing node to receive an output signal of the first inverter as a gate input.

7. The precharging circuit of claim 6, wherein the precharging unit comprises:
a second inverter configured to invert the precharge control signal;
a third inverter configured to invert the output signal of the second inverter;
a first NMOS transistor connected between the input/output line pair to receive the output signal of the second inverter as a gate input;
a third PMOS transistor connected between the input/output line pair to receive an output signal of the third inverter as a gate input;
a fourth PMOS transistor connected between the voltage providing node and an input/output line of the input/output line pair to receive the output signal of the third inverter as a gate input; and
a fifth PMOS transistor connected between the voltage providing node and the other input/output line of the input/output line pair to receive the output signal of the third inverter as a gate input.

8. The precharging circuit of claim 1, wherein the precharging unit is configured to equalize the input/output line pair in response to the precharge control signal.

9. A semiconductor memory device comprising:
a write driver configured to transmit data loaded on a global line to a local line pair;
a read driver configured to transmit data loaded on the local line pair to the global line;
a core region configured to store data loaded on the local line pair or provide stored data to the local line pair; and
a precharging circuit configured to precharge the local line pair by selectively using a first voltage and a second voltage in response to a precharge control signal and an operation mode signal, wherein the second voltage is lower than the first voltage.

10. The semiconductor memory device of claim 9, wherein the precharging circuit comprises:
a voltage selection providing unit configured to selectively provide the first voltage and the second voltage in response to the operation mode signal; and
a precharging unit configured to precharge the local line pair with the selected voltage provided from the voltage selection providing unit in response to the precharge control signal.

11. The semiconductor memory device of claim 10, wherein the second voltage is equal to a half of the first voltage.

12. The semiconductor memory device of claim 11, wherein the first voltage is a core voltage and the second voltage is a bit line precharge voltage.

13. The semiconductor memory device of claim 10, wherein different logic levels of the operation mode signal indicate a read operation mode and a write operation mode, respectively.

14. The semiconductor memory device of claim 13, wherein the voltage selection providing unit is configured to provide the first voltage to the precharging unit in the read operation mode.

15. The semiconductor memory device of claim 14, wherein the voltage selection providing unit is configured to provide the second voltage to the precharging unit in the write operation mode.

16. The semiconductor memory device of claim 10, wherein the voltage selection providing unit comprises:
a first PMOS transistor connected between a first voltage terminal and a voltage providing node to receive the operation mode signal as a gate input;
a first inverter configured to invert the operation mode signal; and
a second PMOS transistor connected between a second voltage terminal and the voltage providing node to receive an output signal of the first inverter as a gate input.

17. The semiconductor memory device of claim 16, wherein the precharging unit comprises:
a second inverter configured to invert the precharge control signal;
a third inverter configured to invert an output signal of the second inverter;
a first NMOS transistor connected between the local line pair to receive the output signal of the second inverter as a gate input;
a third PMOS transistor connected between the local line pair to receive an output signal of the third inverter as a gate input;
a fourth PMOS transistor connected between the voltage providing node and a local line of the local line pair to receive the output signal of the third inverter as a gate input; and
a fifth PMOS transistor connected between the voltage providing node and the other local line of the local line pair to receive the output signal of the third inverter as a gate input.

18. The semiconductor memory device of claim 17, wherein the precharging unit is configured to equalize the local line pair in response to the precharge control signal.

19. A precharging circuit comprising:
a precharging control unit configured to receive a precharge signal according to an operation command and output a precharge control signal by restricting a toggling period of the precharge signal in response to a operation mode signal; and
a precharging unit configured to precharge an input/output line pair in response to the precharge control signal.

20. The precharging circuit of claim 19, wherein different logic levels of the operation mode signal indicate a read operation mode and a write operation mode, respectively, and the operation command includes a read command and a write command.

21. The precharging circuit of claim 20, wherein the precharging control unit is configured to activate the precharge control signal in the read operation mode.

22. The precharging circuit of claim 21, wherein the precharging control unit is configured to activate the precharge control signal in the write operation mode when a data mask signal is activated.

23. The precharging circuit of claim 19, wherein the precharging control unit comprises:
a toggling period restricting unit configured to restrict a toggling period of the precharge signal in response to the operation mode signal;
an activation period determining unit configured to determine an activation period of the precharge control signal in response to the operation mode signal, a data mask precharge signal, and data mask signal; and
an output unit configured to output the precharge control signal in response to an output signal of the toggling period restricting unit and an output signal of the activation period determining unit.

24. A semiconductor memory device comprising:
- a write driver configured to transmit data loaded on a global line to a local line pair;
- a read driver configured to transmit data loaded on the local line pair to the global line;
- a core region configured to store data loaded on the local line pair or provide stored data to the local line pair; and
- a precharging circuit configured to restrictively precharge the local line pair in response to a precharge signal, an operation mode signal, and a data mask signal.

25. The semiconductor memory device of claim 24, wherein the precharge signal is toggled according to a read command and a write command, and different logic levels of the operation mode signal indicate a read operation mode and a write operation, respectively.

26. The semiconductor memory device of claim 25, wherein the precharging circuit comprises:
- a precharging control unit configured to output a precharge control signal by restricting a toggling period of the precharge signal in response to the operation mode signal and the data mask signal; and
- a precharging unit configured to precharge the local line pair in response to the precharge control signal.

27. The semiconductor memory device of claim 26, wherein the precharging control unit is configured to activate the precharge control signal in the read operation mode.

28. The semiconductor memory device of claim 27, wherein the precharging control unit is configured to activate the precharge control signal in the write operation mode when a data mask signal is activated.

29. The semiconductor memory device of claim 28, wherein the precharging control unit comprises:
- a toggling period restricting unit configured to restrict a toggling period of the precharge signal in response to the operation mode signal;
- an activation period determining unit configured to determine an activation period of the precharge control signal in response to the operation mode signal, the data mask signal, and the data mask precharge signal; and
- an output unit configured to output the precharge control signal in response to an output signal of the toggling period restricting unit and an output signal of the activation period determining unit.

* * * * *